(12) United States Patent
Shi et al.

(10) Patent No.: US 9,787,054 B2
(45) Date of Patent: Oct. 10, 2017

(54) OPTICAL PACKAGE PROVIDING EFFICIENT COUPLING BETWEEN DFB-LD AND SILICON PIC EDGE COUPLERS WITH LOW RETURN LOSS

(71) Applicant: SiFotonics Technologies Co., Ltd., Grand Cayman, KY (US)

(72) Inventors: Tuo Shi, Beijing (CN); Ning Zhang, Beijing (CN); Yongbo Shao, Beijing (CN); Tzung-I Su, Zhongli (TW); Dong Pan, Andover, MA (US)

(73) Assignee: SiFotonics Technologies Co., Ltd., Grand Cayman (KY)

( * ) Notice: Subject to any disclaimer, the term of this patent is extended or adjusted under 35 U.S.C. 154(b) by 0 days.

(21) Appl. No.: 15/143,019

(22) Filed: Apr. 29, 2016

(65) Prior Publication Data

US 2016/0329680 A1    Nov. 10, 2016

Related U.S. Application Data

(60) Provisional application No. 62/179,361, filed on May 5, 2015.

(51) Int. Cl.
*H01S 5/022*    (2006.01)
*H01S 5/12*    (2006.01)

(52) U.S. Cl.
CPC ...... *H01S 5/02284* (2013.01); *H01S 5/02208* (2013.01); *H01S 5/12* (2013.01); *H01S 5/02288* (2013.01)

(58) Field of Classification Search
CPC ........ H01S 5/12–5/125; H01S 5/02288; H01S 5/02284; G02B 6/10–6/12033; G02B 6/122–6/138; G02B 2006/12083–2006/12197; G02B 2006/12061

See application file for complete search history.

(56) References Cited

U.S. PATENT DOCUMENTS

| 5,121,451 | A | * | 6/1992 | Grard | ............... | G02F 1/093 |
| | | | | | | 385/33 |
| 5,264,392 | A | * | 11/1993 | Gaebe | ............... | G02B 6/12004 |
| | | | | | | 257/E25.032 |

(Continued)

FOREIGN PATENT DOCUMENTS

DE    102008055128    *    7/2010    ........... G02B 6/3636

*Primary Examiner* — Joshua King
(74) *Attorney, Agent, or Firm* — Han IP Corporation; Andy M. Han

(57) ABSTRACT

An optical package for providing efficient coupling between a distributed feedback laser diode (DFB-LD) and a silicon photonic integrated-circuit chip (Si PIC) edge couplers with low return loss, as well as variations thereof, is described. The optical package may include a DFB-LD, a Si PIC, a single mode fiber or fiber array assembly, a lens and a spacer. The Si PIC may include an input edge coupler and an output edge coupler. The single mode fiber or fiber array assembly may be aligned to the output edge coupler. The lens may be disposed between the DFB-LD and the input edge coupler, and may be configured to minimize a mismatch between an output spot size of the DFB-LD and a spot size of the input edge coupler of the Si PIC. The spacer may be bonded to a facet of the input edge coupler with an index matching fluid.

20 Claims, 4 Drawing Sheets

(56) References Cited

U.S. PATENT DOCUMENTS

| | | | | |
|---|---|---|---|---|
| 5,852,696 A * | 12/1998 | Collins | G02B 6/423 | 385/88 |
| 5,854,870 A * | 12/1998 | Helmfrid | G02F 1/377 | 359/328 |
| 6,356,692 B1 * | 3/2002 | Ido | G02B 6/12007 | 385/129 |
| 6,530,698 B1 * | 3/2003 | Kuhara | G02B 6/4214 | 385/88 |
| 6,757,499 B1 * | 6/2004 | Aoki | H04B 10/504 | 372/32 |
| 7,539,370 B2 * | 5/2009 | Yamazaki | G02B 6/30 | 385/14 |
| 8,213,751 B1 * | 7/2012 | Ho | G02B 6/305 | 385/1 |
| 8,285,149 B2 * | 10/2012 | Bai | G02B 6/12019 | 398/142 |
| 8,285,151 B2 * | 10/2012 | Shen | G02B 6/12019 | 398/142 |
| 8,326,100 B2 | 12/2012 | Chen et al. | | |
| 8,798,409 B2 * | 8/2014 | Pardo | G02B 6/12019 | 385/129 |
| 9,002,163 B2 * | 4/2015 | Fang | G02B 6/1228 | 385/129 |
| 2003/0035459 A1 * | 2/2003 | Wilson | H01S 5/146 | 372/97 |
| 2003/0039015 A1 * | 2/2003 | Vujkovic-Cvijin | H01S 3/1303 | 398/197 |
| 2003/0123498 A1 * | 7/2003 | Ishino | G02B 6/305 | 372/21 |
| 2004/0057653 A1 * | 3/2004 | Fukuda | G02B 6/124 | 385/14 |
| 2007/0223552 A1 * | 9/2007 | Muendel | G02B 6/12004 | 372/50.12 |
| 2008/0013881 A1 * | 1/2008 | Welch | G02B 6/12004 | 385/14 |
| 2008/0080866 A1 * | 4/2008 | Bai | H04J 14/02 | 398/87 |
| 2008/0131052 A1 * | 6/2008 | Matsumura | G02B 3/0087 | 385/33 |
| 2009/0010592 A1 * | 1/2009 | Yamazaki | G02B 6/30 | 385/14 |
| 2009/0252456 A1 * | 10/2009 | Rasras | G02B 6/305 | 385/43 |
| 2010/0208756 A1 * | 8/2010 | Noh | G02B 6/4206 | 372/20 |
| 2010/0232462 A1 * | 9/2010 | Shen | G02B 6/12019 | 372/36 |
| 2012/0027041 A1 * | 2/2012 | Yamazaki | G02B 6/12004 | 372/50.12 |
| 2013/0022323 A1 * | 1/2013 | Takizawa | H01S 5/022 | 385/92 |
| 2013/0209112 A1 * | 8/2013 | Witzens | G02B 6/2813 | 398/214 |
| 2014/0153873 A1 * | 6/2014 | Kang | G02B 6/34 | 385/37 |

* cited by examiner

OPTICAL PACKAGE PROVIDING EFFICIENT COUPLING BETWEEN DFB-LD AND SILICON PIC EDGE COUPLERS WITH LOW RETURN LOSS

CROSS-REFERENCE TO RELATED PATENT APPLICATION(S)

The present disclosure is a non-provisional application of, and claims the priority benefit of, U.S. Provisional Patent Application No. 62/179,361, filed on 5 May 2015, which is herein incorporated by reference in its entirety.

TECHNICAL FIELD

The present disclosure is related to optical packages. More particularly, the present disclosure is directed to an optical package for providing efficient coupling between a distributed feedback laser diode and a silicon photonic integrated-circuit chip edge couplers with low return loss.

BACKGROUND

Silicon photonic integrated circuits (Si PIC) have attracted tremendous attention due to their high density integration capabilities of coupler, modulator, photodiode, avalanche photodiode, polarization diversity components and multimode interferometers. However, link budget deficiency has limited the application of Si PIC. In one aspect, the coupling efficiency of distributed feedback lasers (DFB-LD) and Si PIC has major influence on the link budget.

Up to the present time, there are two coupling structures adopted in Si PICs. The first coupling structure is grating coupler, which is favored for its on-chip characterizing compatibilities and high coupling efficiency with less than 2 dB insertion loss. However, one disadvantage of grating coupler is its limited spectral bandwidth, and the typical bandwidth within 1 dB variation is less than 20 nm. Another less-apparent but significant disadvantage is that its vertical packaging structure cannot be easily designed into QSFP28 form factors which have been the main stream packaging form factors in data center applications.

The second coupling structure is edge coupler, usually with an inverse tapered silicon waveguide surrounded by a $SiO_2$ cantilever structure. Edge couplers are in-plane structures which can be fully compatible with QSFP form factors. Edge couplers may provide less than 2 dB insertion loss to single mode fiber. Edge couplers may also demonstrate coupling tolerance comparable with single mode fiber and very wide spectral bandwidth supporting O-band and C-band simultaneously. Nevertheless, the coupling loss of a DFB-LD is still beyond the acceptable range, due to the mismatch of DFB-LD mode size and edge coupler mode size. Lenses have been adopted to overcome the mismatch between two modes. However, most commercially available lenses are not designed for the coupling between DFB-LD and Si PIC edge coupler, as shown in FIG. 4, but are designed for coupling between DFB-LD and single mode fiber. In FIG. 4, the conventional coupling scheme 400 simply utilizes a lens to couple an output optical beam into an edge coupler of a Si PIC. Thus, it is not easy to find a suitable lens to optimize the coupling between DFB-LD and Si PIC edge coupler.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

The present disclosure aims to address aforementioned issues associated with conventional coupling structures. Advantageously, the present disclosure provides a novel high-efficient optical package that optimizes the coupling between DFB-LD and Si PIC edge coupler with suppressed return loss.

In one aspect, an optical package may include a DFB-LD, a Si PIC, a single mode fiber or fiber array assembly, a lens and a spacer. The Si PIC may include at least one input edge coupler and at least one output edge coupler. The single mode fiber or fiber array assembly may be aligned to the at least output edge coupler of the Si PIC. The lens may be disposed between the DFB-LD and the at least one input edge coupler of the Si PIC, and may be configured to minimize a mismatch between an output spot size of the DFB-LD and a spot size of the at least one input edge coupler of the Si PIC. The spacer may be bonded to a facet of the at least one input edge coupler of the Si PIC with an index matching fluid.

In another aspect, an optical package may include a DFB-LD, a Si PIC, a single mode fiber or fiber array assembly, a lens and an isolator. The Si PIC may include at least one input edge coupler and at least one output edge coupler. The single mode fiber or fiber array assembly may be aligned to the at least output edge coupler of the Si PIC. The lens may be disposed between the DFB-LD and the at least one input edge coupler of the Si PIC, and may be configured to minimize a mismatch between an output spot size of the DFB-LD and a spot size of the at least one input edge coupler of the Si PIC. The isolator may be bonded to a facet of the at least one input edge coupler of the Si PIC with an index matching fluid.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Detailed embodiments of the claimed subject matters are disclosed herein. However, it shall be understood that the disclosed embodiments are merely illustrative of the claimed subject matters which may be embodied in various forms. The present disclosure may, however, be embodied in many different forms and should not be construed as limited to the exemplary embodiments set forth herein. Rather, these exemplary embodiments are provided so that description of the present disclosure is thorough and complete and will fully convey the scope of the present disclosure to those skilled in the art. In the description below, details of well-known features and techniques may be omitted to avoid unnecessarily obscuring the presented embodiments.

Figure 1:
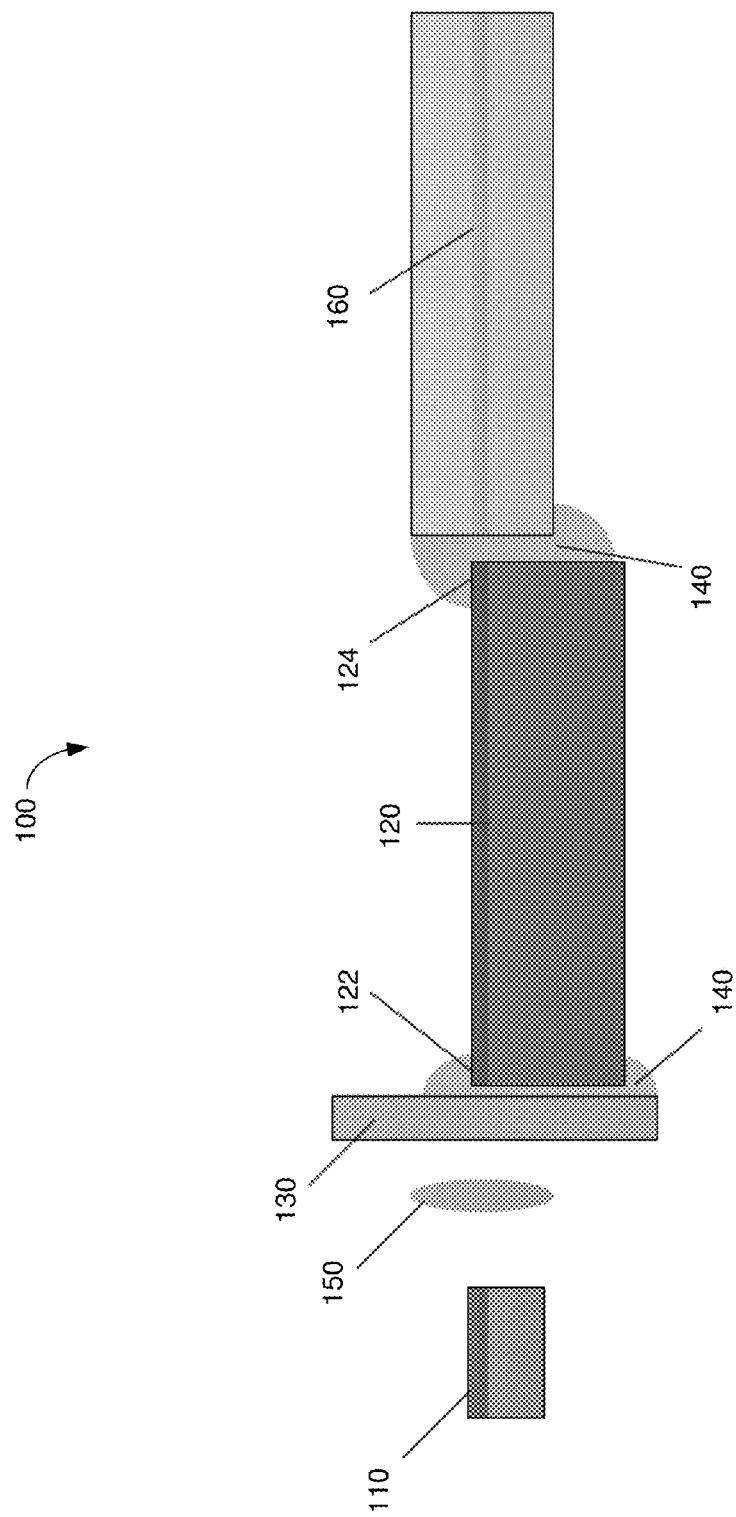
FIG. 1 is a diagram of a high-efficiency optical package in accordance with an embodiment of the present disclosure.

The present disclosure provides various embodiments of a novel high-efficient optical package which optimizes the coupling between DFB-LD and Si PIC edge coupler with low return loss. In general, a high-efficient optical package in accordance with the present disclosure may include a DFB-LD, a Si PIC, a lens, a single mode fiber or a fiber array assembly, and a spacer or an isolator. The lens may be inserted or otherwise disposed between the DFB-LD and an input edge coupler of the Si PIC. The single mode fiber or fiber array assembly may be coupled to an output edge coupler of the Si PIC with an index matching fluid filled in an air gap therebetween. The spacer may be a silica double-polished spacer bonded to a facet of the input edge coupler of the Si PIC with the index matching fluid filling the air gap, as shown in FIG. 1. The silica spacer may be utilized as a container or adhesion surface for filling the index matching fluid, thus allowing expansion of the mode size of the edge coupler. Furthermore, an opposite surface of the silica spacer may be anti-reflection coated to help reduce return loss.

FIG. 1 illustrates a high-efficiency optical package 100 in accordance with an embodiment of the present disclosure. Optical package 100 may include a high-efficiency coupling structure between a DFB-LD 110 and a Si PIC 120. Si PIC 120 may have at least one input edge coupler 122 and at least one output edge coupler 124. A silica spacer (or isolator) 130 may be bonded to a facet of the at least one input edge coupler 122 with an index matching fluid 140. A lens 150 may be inserted or otherwise disposed between DFB-LD 110 and spacer or isolator 130. A single mode fiber or fiber array assembly 160 may be aligned to the at least output edge coupler 124 of the Si PIC 120. The single mode fiber or fiber array assembly 160 may be bonded to a facet of the at least one output edge coupler 124 with the index matching fluid 140.

Figure 2:
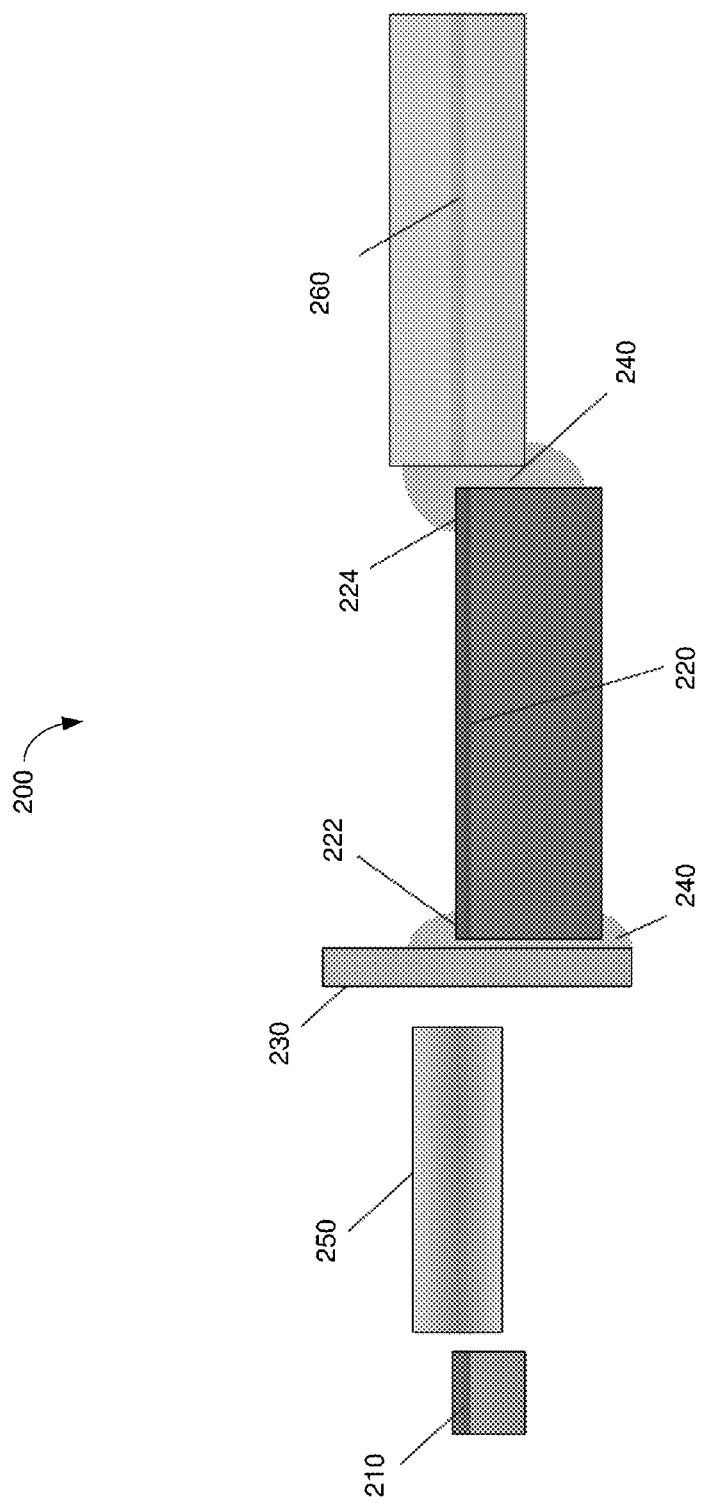
FIG. 2 is a diagram of a high-efficiency optical package in accordance with another embodiment of the present disclosure.

FIG. 2 illustrates a high-efficiency optical package 200 in accordance with another embodiment of the present disclosure. Optical package 200 may include a high-efficiency coupling structure between a DFB-LD 210 and a Si PIC 220. Si PIC 220 may have at least one input edge coupler 222 and at least one output edge coupler 224. A silica spacer (or isolator) 230 may be bonded to a facet of the at least one input edge coupler 222 with an index matching fluid 240. The index matching fluid 240 may be ultra-violet (UV) curable and/or UV cured. A gradient index (GRIN) lens 250 may be inserted or otherwise disposed between DFB-LD 210 and spacer or isolator 230. A single mode fiber or fiber array assembly 260 may be aligned to the at least output edge coupler 224 of the Si PIC 220. The single mode fiber or fiber array assembly 260 may be bonded to a facet of the at least one output edge coupler 224 with the index matching fluid 240.

Figure 3:
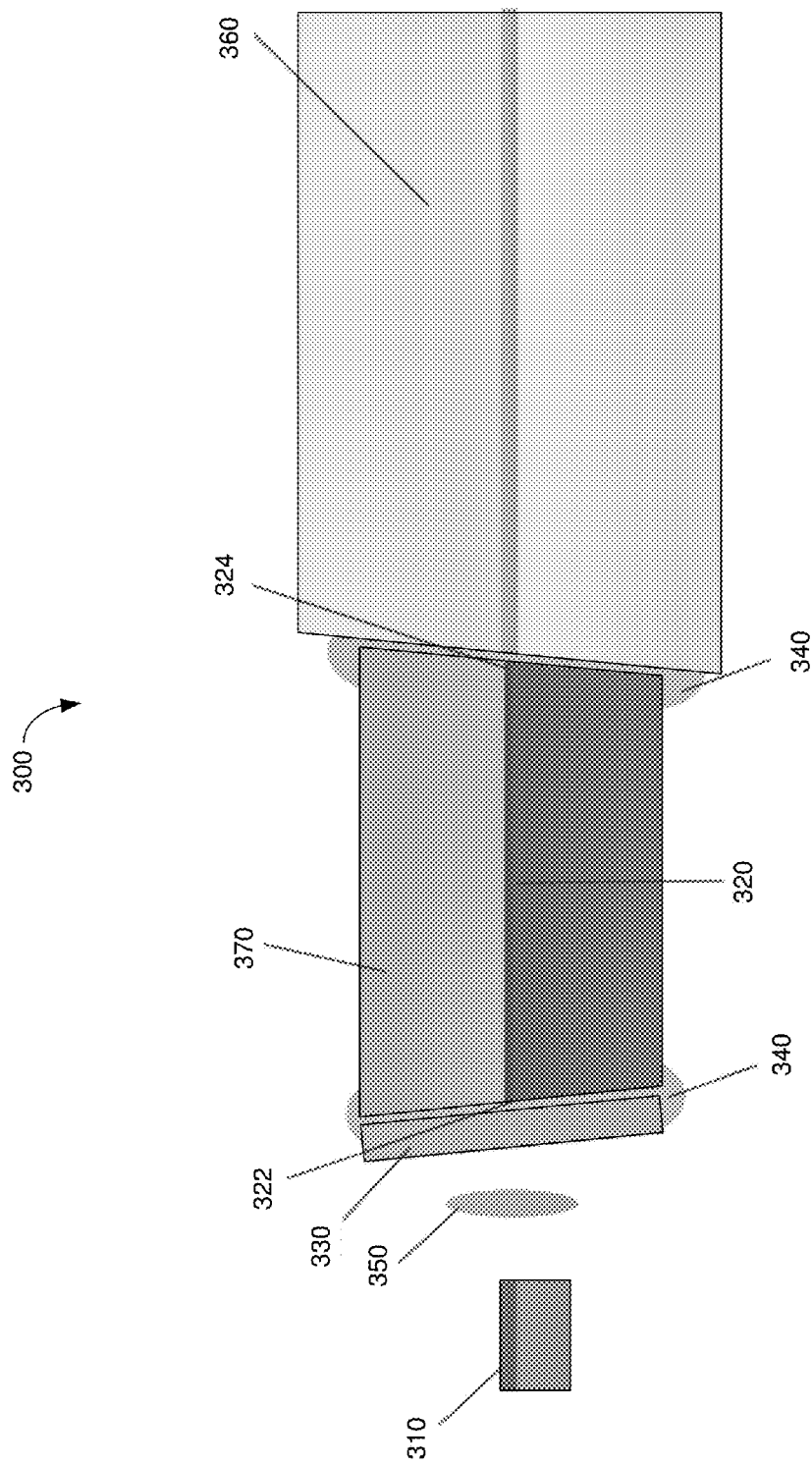
FIG. 3 is a diagram of a high-efficiency and low-return-loss optical package in accordance with an embodiment of the present disclosure.
Figure 4:
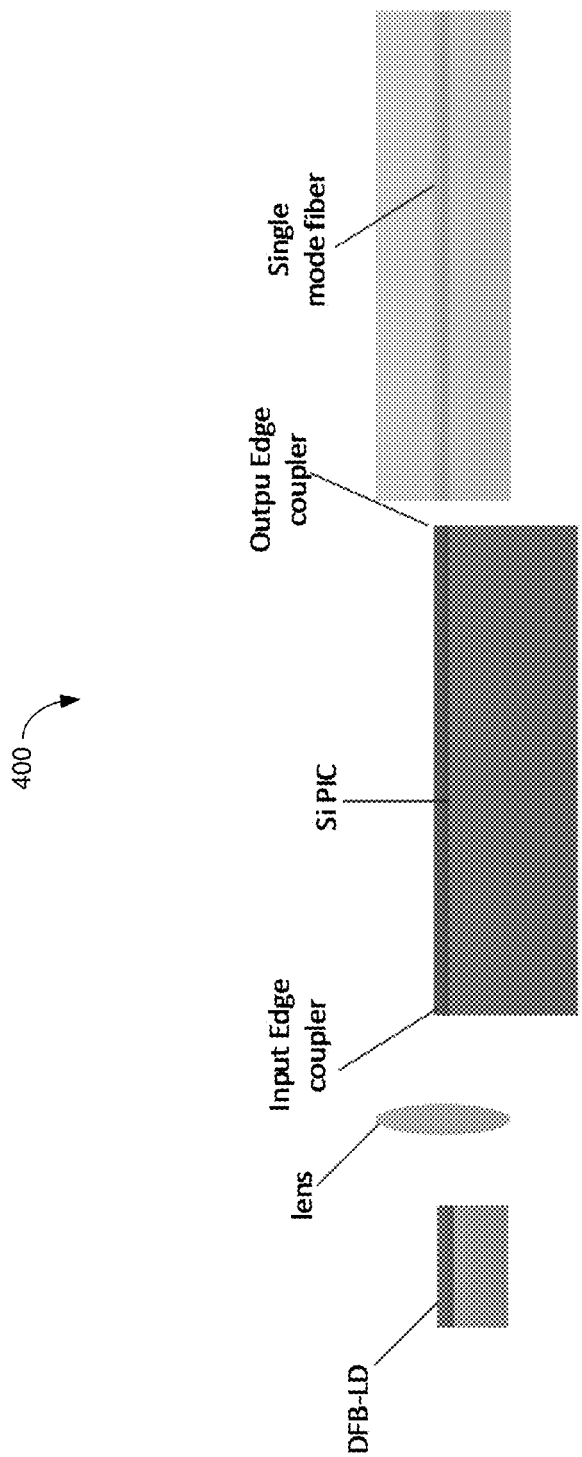
FIG. 4 is a diagram of a conventional coupling scheme in the prior art.

FIG. 3 illustrates a high-efficiency and low-return-loss optical package 300 in accordance with an embodiment of the present disclosure. Optical package 300 may include a high-efficiency coupling structure between a DFB-LD 310 and a Si PIC 320. Si PIC 320 may have at least one input edge coupler 322 and at least one output edge coupler 324. A silica spacer (or isolator) 330 may be bonded to a facet of the at least one input edge coupler 322 with an index matching fluid 340. The index matching fluid 340 may be ultra-violet (UV) curable and/or UV cured. A lens 350 may be inserted or otherwise disposed between DFB-LD 310 and spacer or isolator 330. A single mode fiber or fiber array assembly 360 may be aligned to the at least output edge coupler 324 of the Si PIC 320. The single mode fiber or fiber array assembly 360 may be bonded to a facet of the at least one output edge coupler 324 with the index matching fluid 340. A facet of the at least one input edge coupler 322 (e.g., the facet facing the spacer or isolator 330) may be tilt-polished. Alternatively or additionally, a facet of the at least one output edge coupler 324 (e.g., the facet facing the single mode fiber or fiber array assembly 360) may be tilt-polished. The Si PIC 320 may be covered with at least one silica cover lid 370.

In view of the above, select features of various embodiments in accordance with the present disclosure are described below.

In one aspect, an optical package may include a DFB-LD, a Si PIC, a single mode fiber or fiber array assembly, a lens and a spacer. The Si PIC may include at least one input edge coupler and at least one output edge coupler. The single mode fiber or fiber array assembly may be aligned to the at least output edge coupler of the Si PIC. The lens may be disposed between the DFB-LD and the at least one input edge coupler of the Si PIC, and may be configured to minimize a mismatch between an output spot size of the DFB-LD and a spot size of the at least one input edge coupler of the Si PIC. The spacer may be bonded to a facet of the at least one input edge coupler of the Si PIC with an index matching fluid.

In some embodiments, the spacer may include a silica spacer, a glass spacer, a polymer spacer, a polyimide spacer, an epoxy spacer, or a resin spacer.

In some embodiments, the spacer may include a double-side polished spacer.

In some embodiments, a first surface of the spacer facing toward the lens may be coated with an anti-reflection film.

In some embodiments, the at least one input edge coupler may include a cantilever structure edge coupler or an anchored-cantilever structure edge coupler.

In some embodiments, the optical package may also include at least one silica cover lid. The Si PIC may be covered with the at least one silica cover lid. In some embodiments, the facet of the at least one input edge coupler may be tilt-polished, as shown in FIG. 3. Alternatively or additionally, a facet of the at least one output edge coupler may be tilt-polished, as shown in FIG. 3.

In some embodiments, the lens may include a ball lens, an aspheric lens, a GRIN lens, or a set of collimator lenses.

In some embodiments, the single mode fiber may be fixed to a facet of the at least one output edge coupler with the index matching fluid.

In some embodiments, the DFB-LD may be configured to operate at a wavelength range of C-band, O-band, or a combination thereof.

In some embodiments, the DFB-LD and the lens may be packaged as one packaged component. In some embodiments, a type of the one packaged component is a transistor outline can (TO-can) type or a butterfly type.

In some embodiments, the index matching fluid may be UV curable.

In some embodiments, the lens may include a GRIN lens, as shown in FIG. 2. The GRIN lens may be bonded to a second surface of the spacer with UV-curable epoxy or resin.

In another aspect, an optical package may include a DFB-LD, a Si PIC, a single mode fiber or fiber array assembly, a lens and an isolator. The Si PIC may include at least one input edge coupler and at least one output edge coupler. The single mode fiber or fiber array assembly may be aligned to the at least output edge coupler of the Si PIC. The lens may be disposed between the DFB-LD and the at least one input edge coupler of the Si PIC, and may be configured to minimize a mismatch between an output spot size of the DFB-LD and a spot size of the at least one input edge coupler of the Si PIC. The isolator may be bonded to a facet of the at least one input edge coupler of the Si PIC with an index matching fluid.

In some embodiments, the isolator may include a double-side polished isolator.

In some embodiments, a first surface of the isolator facing toward the lens may be coated with an anti-reflection film.

In some embodiments, the at least one input edge coupler may include a cantilever structure edge coupler or an anchored-cantilever structure edge coupler.

In some embodiments, the optical package may also include at least one silica cover lid. The Si PIC may be covered with the at least one silica cover lid. In some embodiments, the facet of the at least one input edge coupler may be tilt-polished, as shown in FIG. 3. Alternatively or additionally, a facet of the at least one output edge coupler may be tilt-polished, as shown in FIG. 3.

In some embodiments, the lens may include a ball lens, an aspheric lens, a GRIN lens, or a set of collimator lenses.

In some embodiments, the single mode fiber may be fixed to a facet of the at least one output edge coupler with the index matching fluid.

In some embodiments, the DFB-LD may be configured to operate at a wavelength range of C-band, O-band, or a combination thereof.

In some embodiments, the DFB-LD and the lens may be packaged as one packaged component. In some embodiments, a type of the one packaged component is a TO-can type or a butterfly type.

In some embodiments, the index matching fluid may be UV curable.

In some embodiments, the lens may include a GRIN lens, as shown in FIG. 2. The GRIN lens may be bonded to a second surface of the isolator with UV-curable epoxy or resin.

Additional Notes

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. An optical package, comprising:
a distributed feedback laser diode (DFB-LD);
a silicon photonic integrated-circuit chip (Si PIC) comprising at least one input edge coupler and at least one output edge coupler;
a single mode fiber or fiber array assembly aligned to the at least output edge coupler of the Si PIC;
a lens disposed between the DFB-LD and the at least one input edge coupler of the Si PIC, the lens configured to minimize a mismatch between an output spot size of the DFB-LD and a spot size of the at least one input edge coupler of the Si PIC; and
a spacer bonded to a facet of the at least one input edge coupler of the Si PIC with an index matching fluid.

2. The optical package of claim 1, wherein the spacer comprises a silica spacer, a glass spacer, a polymer spacer, a polyimide spacer, an epoxy spacer, or a resin spacer.

3. The optical package of claim 1, wherein the spacer comprises a double-side polished spacer.

4. The optical package of claim 1, wherein a first surface of the spacer facing toward the lens is coated with an anti-reflection film.

5. The optical package of claim 1, wherein the at least one input edge coupler comprises a cantilever structure edge coupler or an anchored-cantilever structure edge coupler.

6. The optical package of claim 1, further comprising:
at least one silica cover lid,
wherein the Si PIC is covered with the at least one silica cover lid.

7. The optical package of claim 1, wherein the facet of the at least one input edge coupler is tilt-polished.

8. The optical package of claim 1, wherein a facet of the at least one output edge coupler is tilt-polished.

9. The optical package of claim 1, wherein the lens comprises a ball lens, an aspheric lens, a gradient index (GRIN) lens, or a set of collimator lenses.

10. The optical package of claim 1, wherein the single mode fiber is fixed to a facet of the at least one output edge coupler with the index matching fluid.

11. The optical package of claim 1, wherein the DFB-LD is configured to operate at a wavelength range of C-band, O-band, or a combination thereof.

12. The optical package of claim 1, wherein the DFB-LD and the lens are packaged as one packaged component.

13. The optical package of claim 12, wherein a type of the one packaged component is a transistor outline can (TO-can) type or a butterfly type.

14. The optical package of claim 1, wherein the index matching fluid is ultra-violet (UV) curable.

15. The optical package of claim 1, wherein the lens comprises a GRIN lens, and wherein the GRIN lens is bonded to a second surface of the spacer with UV-curable epoxy or resin.

16. An optical package, comprising:
a distributed feedback laser diode (DFB-LD);
a silicon photonic integrated-circuit chip (Si PIC) comprising at least one input edge coupler and at least one output edge coupler;
a single mode fiber or fiber array assembly aligned to the at least output edge coupler of the Si PIC;
a lens disposed between the DFB-LD and the at least one input edge coupler of the Si PIC, the lens configured to minimize a mismatch between an output spot size of the DFB-LD and a spot size of the at least one input edge coupler of the Si PIC; and
an isolator bonded to a facet of the at least one input edge coupler of the Si PIC with an index matching fluid,
wherein the at least one input edge coupler comprises a cantilever structure edge coupler or an anchored-cantilever structure edge coupler, and
wherein the index matching fluid is ultra-violet (UV) curable.

17. The optical package of claim 16, further comprising:
at least one silica cover lid,
wherein the Si PIC is covered with the at least one silica cover lid,
wherein the facet of the at least one input edge coupler is tilt-polished, and wherein a facet of the at least one output edge coupler is tilt-polished.

18. The optical package of claim 16, wherein the lens comprises a ball lens, an aspheric lens, a gradient index (GRIN) lens, or a set of collimator lenses.

19. The optical package of claim 16, wherein the lens comprises a GRIN lens, and wherein the GRIN lens is bonded to a second surface of the spacer with UV-curable epoxy or resin.

20. The optical package of claim 16, wherein the single mode fiber is fixed to a facet of the at least one output edge coupler with the index matching fluid, wherein the DFB-LD is configured to operate at a wavelength range of C-band, O-band, or a combination thereof, wherein the DFB-LD and the lens are packaged as one packaged component, and wherein a type of the one packaged component is a transistor outline can (TO-can) type or a butterfly type.

* * * * *